United States Patent
Mao et al.

(10) Patent No.: US 12,224,371 B2
(45) Date of Patent: Feb. 11, 2025

(54) HIGH-SPEED LAYOUT METHOD AND LAYOUT DEVICE FOR PHOTOVOLTAIC MODULES

(71) Applicant: SUZHOU SC-SOLAR EQUIPMENT CO., LTD, Suzhou (CN)

(72) Inventors: Jiliang Mao, Suzhou (CN); Zeliang Dong, Suzhou (CN); Ruibo Niu, Suzhou (CN); Guo Ma, Suzhou (CN); Zhiwei Yu, Suzhou (CN)

(73) Assignee: SUZHOU SC-SOLAR EQUIPMENT CO., LTD, Suzhou (CN)

( * ) Notice: Subject to any disclaimer, the term of this patent is extended or adjusted under 35 U.S.C. 154(b) by 0 days.

(21) Appl. No.: 18/729,977

(22) PCT Filed: Sep. 19, 2023

(86) PCT No.: PCT/CN2023/119566
§ 371 (c)(1),
(2) Date: Jul. 18, 2024

(87) PCT Pub. No.: WO2024/119953
PCT Pub. Date: Jun. 13, 2024

(65) Prior Publication Data
US 2024/0421244 A1    Dec. 19, 2024

(30) Foreign Application Priority Data

Dec. 5, 2022 (CN) .......................... 202211547522.4

(51) Int. Cl.
*H01L 31/18* (2006.01)
*H01L 21/677* (2006.01)
*H01L 21/68* (2006.01)

(52) U.S. Cl.
CPC ...... *H01L 31/188* (2013.01); *H01L 21/67742* (2013.01); *H01L 21/6776* (2013.01); *H01L 21/68* (2013.01)

(58) Field of Classification Search
None
See application file for complete search history.

(56) References Cited

FOREIGN PATENT DOCUMENTS

| CN | 107639362 A | 1/2018 | |
|---|---|---|---|
| CN | 108529219 | * 9/2018 | ............. B65G 47/91 |

(Continued)

OTHER PUBLICATIONS

International Search Report and Written Opinion; China National Intellectual Property Administration; International Application No. PCT/CN2023/119566; Nov. 3, 2023; 22 pages.

*Primary Examiner* — Hsien Ming Lee
(74) *Attorney, Agent, or Firm* — Taft Stettinius & Hollister LLP

(57) ABSTRACT

A high-speed layout device for a photovoltaic module includes a module input unit, a module output unit, a tray transfer unit, and a layout transfer unit. The tray transfer unit extends into a position below the module input unit to lift the photovoltaic module, moves horizontally, places the photovoltaic module on the module output unit for outputting, and then returns to the position below the module input unit. A layout of a middle row of battery strings is performed on the tray transfer unit, a layout of a first row of battery strings is performed on the input unit or the tray transfer unit, and a layout of a last row of battery strings is performed on the tray transfer unit or the output unit, wherein the layout of the first row of battery strings and the layout of the last row of battery strings are performed on different units.

12 Claims, 9 Drawing Sheets

(56) References Cited

FOREIGN PATENT DOCUMENTS

| | | |
|---|---|---|
| CN | 108529219 A | 9/2018 |
| CN | 209328934 U | 8/2019 |
| CN | 111710757 A | 9/2020 |
| CN | 115172527 A | 10/2022 |
| CN | 115548168 A | 12/2022 |
| DE | 102010016976 A1 | 3/2012 |

* cited by examiner

HIGH-SPEED LAYOUT METHOD AND
LAYOUT DEVICE FOR PHOTOVOLTAIC
MODULES

CROSS REFERENCE TO RELATED
APPLICATIONS

The present application is a National Stage Application filed under 35 U.S.C. 371 based on International Patent Application No. PCT/CN2023/119566 filed on Sep. 19, 2023, which claims priority to Chinese Patent Application No. 202211547522.4; filed on Dec. 5, 2022, the disclosures of which are incorporated herein by reference in their entireties.

TECHNICAL FIELD

The present application belongs to the technical field of photovoltaic module layout, for example, relates to a high-speed layout method for a photovoltaic module and a high-speed layout device for a photovoltaic module.

BACKGROUND

In the production process for a photovoltaic module, multiple single battery slices are required to form battery strings firstly, and then the battery strings are typeset on a glass bottom plate through a layout process. With the gradual improvement of the production efficiency of the photovoltaic module, a higher requirement is also put forward for improving the efficiency of a layout device.

In the related art, the patent with publication number CN213878123U discloses a full-automatic high-speed layout machine for a battery string of a solar photovoltaic cell module, the machine includes a feeding transmission mechanism for conveying the module into the layout device, a discharging transmission mechanism for outputting the module, a battery string transmission positioning mechanism for inputting battery strings, a welding strip cutting mechanism for cutting leads at two ends of the battery strings, a glass translation mechanism for transporting the module from the feeding transmission mechanism onto the discharging transmission mechanism, and a six-axis robotic arm for typesetting the battery strings on the glass assembly. When the layout machine performs typesetting, the typesetting operation is started to be performed after the glass translation mechanism completely transports the glass from the main frame onto an auxiliary frame. After a set number of battery strings are typeset on the glass of the photovoltaic module, the next piece of glass enters the feeding transmission mechanism, then the positioning and the correcting are performed, and then the glass translation mechanism moves the glass to the auxiliary frame for typesetting. The layout machine has the following disadvantages.

1) Since the glass translation mechanism is not described in detail in the patent, the specific structure of the glass translation mechanism is unclear. As can be seen from the description of the operation flow of the patent, the typesetting operation is started to be performed after the glass is completely moved from the main frame to the auxiliary frame, the glass translation mechanism mainly plays a role in transferring the glass from the main frame to the auxiliary frame, thus there is a tact time loss for the six-axis robotic arm during a period of waiting for the glass to be transferred in place.

2) When the layout is performed on the glass, the glass does not move, the layout is performed mainly by the six-axis robotic arm. Since positions of each row of battery strings on the glass are different and get father and father away along the placement direction of the battery strings, when the six-axis robotic arm is typesetting and placing the battery strings, on one hand, the six-axis robotic arm is required to have a larger working range, and on the other hand, the six-axis robotic arm has to move a longer distance. Thus, the time consumed for transferring the battery strings is longer and the layout efficiency is low.

3) The layout operation is performed by only one six-axis robotic arm so that the layout efficiency is low.

SUMMARY

The present application provides a high-speed layout method for a photovoltaic module, to achieve the continuous layout operation without intermission and greatly improve the layout efficiency.

The present application provides a high-speed layout method for a photovoltaic module. The method includes that:

a module input unit and a module output unit are configured, where the module input unit is configured to convey the photovoltaic module in a first direction, the module output unit is configured to convey the photovoltaic module in a second direction, and the first direction is perpendicular to the second direction;

a tray transfer unit is configured, where the tray transfer unit is configured to be capable of extending into a position below the module input unit to lift the photovoltaic module on the module input unit upwards, moving in the second direction in a space above the module output unit according to a layout requirement, descending and embedding below the module output unit, placing the photovoltaic module on the module output unit, and returning to the position below the module input unit in the second direction;

a layout transfer unit is configured, where the layout transfer unit is configured to be capable of absorbing battery strings, and placing the battery strings on the photovoltaic module according to the layout requirement;

the battery strings on the photovoltaic module are divided into a first row of battery strings, a middle row of battery strings, and a last row of battery strings, where a layout of the middle row of battery strings is performed on the tray transfer unit, a layout of the first row of battery strings is performed on the module input unit or the tray transfer unit, a layout of the last row of battery strings is performed on the tray transfer unit or the module output unit, and the layout of the first row of battery strings and the layout of the last row of battery strings are performed on different units;

in a process of performing the layout of the first row of battery strings or the layout of the last row of battery strings, the tray transfer unit moves from below the module output unit to below the module input unit; and in a process in which the photovoltaic module on the module input unit is lifted by the tray transfer unit until the layout of the last row of battery strings on the photovoltaic module is finished, operations of input a next photovoltaic module in place and position correction of the next photovoltaic module on the module input unit are completed.

The present application further provides a high-speed layout device for a photovoltaic module. The high-speed layout device for the photovoltaic module performs the layout operation according to the above-described layout method.

REFERENCE LIST

Figure 1:
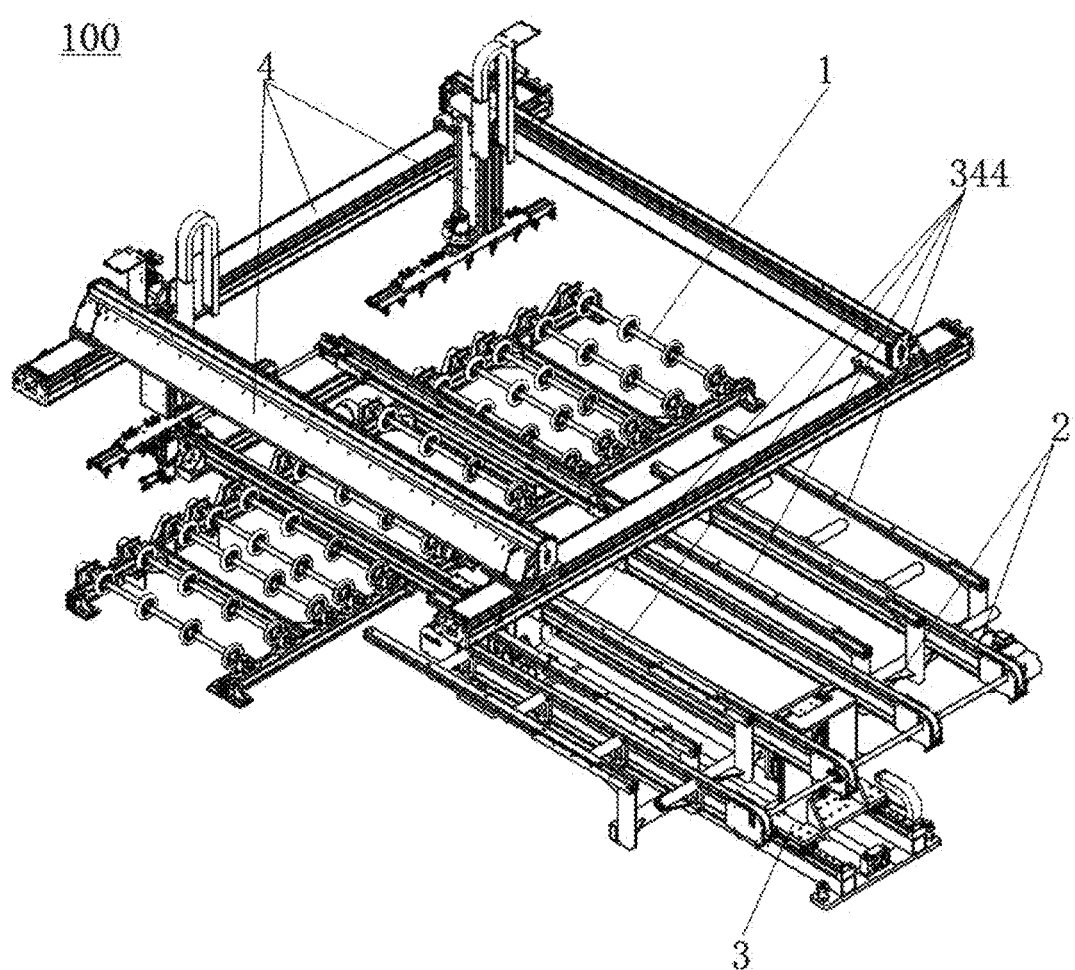
FIG. 1 is a schematic structural diagram of a layout device according to an embodiment one of the present application.

100 high-speed layout device for photovoltaic module
101 photovoltaic module
1 module input unit
11 second avoidance gap
2 module output unit
21 first avoidance gap
3 tray transfer unit
31 first support plate
32 driving member
33 cylinder
34 support frame group
341 second support plate
342 support rod
343 support upright rod
344 support towing rod
4 layout transfer unit

DETAILED DESCRIPTION

Embodiment One

This embodiment provides a high-speed layout method. The method includes that: a module input unit 1 and a module output unit 2 are arranged vertically, that is, a convey direction of the module input unit 1 is perpendicular to a convey direction of the module output unit 2, where the module input unit 1 is configured to convey a photovoltaic module in a first direction, the module output unit 2 is configured to convey the photovoltaic module in a second direction, and the first direction is perpendicular to the second direction; a tray transfer unit 3 is configured, where the tray transfer unit 3 is configured to be capable of extending into a position below the module input unit 1 to lift the photovoltaic module upwards and lift above the module input unit 1, is configured to be capable of lifting the photovoltaic module and moving in the second direction in a space above the module output unit 2 according to a layout requirement, and is configured to be capable of descending and embedding below the module output unit 2 and returning to the position below the module input unit 1 in the second direction: one or two layout transfer units 4 are configured, where the one or two layout transfer units 4 are configured to be capable of absorbing battery strings and placing the battery strings on the photovoltaic module according to the layout requirement; and the battery strings on the photovoltaic module are divided into a first row of battery strings, a middle row of battery strings, and a last row of battery strings, where a layout of the middle row of battery strings is performed on the tray transfer unit 3, a layout of the first row of battery strings is performed on the module input unit 1 or the tray transfer unit 3, a layout of the last row of battery strings is performed on the tray transfer unit 3 or the module output unit 2, and the layout of the first row of battery strings and the layout of the last row of battery strings are not all performed on the tray transfer unit 3, that is, the layout of the first row of battery strings and the layout of the last row of battery strings are performed on different units: in a process of performing the layout of the first row of battery strings or the layout of the last row of battery strings, the tray transfer unit 3 completes a movement operation returned from below the module output unit 2 to below the module input unit 1; and in a time period in which the photovoltaic module on the module input unit 1 is lifted by the tray transfer unit 3 until the layout of the last row of battery strings on the photovoltaic module is finished, operations of input a next photovoltaic module in place and position correction of the next photovoltaic module on the module input unit 1 are completed.

According to the above-described method, this embodiment provides an embodiment of the high-speed layout method. In this embodiment, the layout of the first row of battery strings is performed on the module input unit 1, the layout of the last row of battery strings is performed on the module output unit 2, and the layout of the middle row of battery strings is performed on the tray transfer unit 3. The method specifically includes the following steps.

In S1, the photovoltaic module 101 is conveyed in place in the first direction from one end of the module input unit 1, and a position of the photovoltaic module 101 on the module input unit 1 is corrected.

In S2, the layout transfer unit 4 absorbs qualified battery strings and places absorbed qualified battery strings on the photovoltaic module to complete the layout of the first row of battery strings.

In S3, in a process of performing the S1 and the S2, the tray transfer unit 3 extends into the position below the module input unit 1 and is in place.

In S4, after the S2 is finished, the tray transfer unit 3 lifts the photovoltaic module upwards and lifts above a set height of the module input unit 1, where the set height is greater than a thickness of the photovoltaic module, so that a next photovoltaic module can smoothly enter the module input unit 1.

In S5, the tray transfer unit 3 supports the photovoltaic module and moves the photovoltaic module a set step distance in the second direction, where the set step distance is a width of one battery slice.

In S6, the layout transfer unit 4 absorbs qualified battery strings and places absorbed qualified battery strings on the photovoltaic module to complete a layout of a next row of battery strings.

In S7, the S5 and the S6 are repeated for multiple times to complete the layout of the middle row of battery strings, and when the layout of the last row of battery strings is to be performed, the S5 and the S6 are stopped repeating.

In S8, the tray transfer unit 3 supports the photovoltaic module and lowers the photovoltaic module, and places the photovoltaic module on the module output unit 2 to complete a transferring of the photovoltaic module. After the photovoltaic module is placed on the module output unit 2, the input of a next photovoltaic module is not influenced.

The expression "not influence the input of the next photovoltaic module" here may be either a non-influence in a horizontal plane or a non-influence in the height. For example, in an embodiment, a height difference exists between a conveyance plane of the module input unit 1 and a conveyance plane of the module output unit 2, and the height difference is greater than the thickness of the photovoltaic module. In this structure design, the photovoltaic module placed on the module output unit 2 does not collide and interfere with a next photovoltaic module input into the module input unit 1. The photovoltaic module on the module output unit 2 and the photovoltaic module on the module input unit 1 are allowed to have an overlapping portion in a height space. In this way, a horizontal spacing between the module input unit 1 and the module output unit 2 can be shortened, so that a size of a layout machine in the second direction is reduced, and thus space is saved. After the layout of the last row of battery strings on the photovoltaic module is completed, the photovoltaic module is output by the module output unit 2, to eliminate the overlapping of two photovoltaic modules in the height space and provide an avoidance space for the rising of the next photovoltaic module. The photovoltaic module on the module output unit 2 and the photovoltaic module on the module input unit 1 may also have no overlapping portion in the height space.

In another embodiment, the conveyance plane of the module input unit 1 is flush with the conveyance plane of the module output unit 2, and the photovoltaic module on the module output unit 2 and the photovoltaic module on the module input unit 1 do not interfere with each other since they have a gap on the horizontal plane.

In S9, the layout transfer unit 4 absorbs qualified battery strings and places absorbed qualified battery strings on the photovoltaic module to complete the layout of the last row of battery strings, and then the module output unit 2 outputs the photovoltaic module whose layout is finished.

In S10, in a process of performing the S5 to the S9, an input of the next photovoltaic module and a position correction of the next photovoltaic module on the module input unit 1 are completed, that is, the next photovoltaic module is input onto the module input unit 1 and is in place, and a position of the next photovoltaic module on the module input unit 1 is corrected.

In S11, after the S9 is finished, input of the next photovoltaic module in place and position correction of the next photovoltaic module are completed, and the layout transfer unit 4 absorbs qualified battery strings and places absorbed qualified battery strings on the next photovoltaic module to complete a layout of a first row of battery strings on the next photovoltaic module, so that the continuous layout operation is achieved, and the tact time consumed in preparation of the layout of the next photovoltaic module is eliminated. The main control time of the whole layout operation mainly depends on the time consumed by operations of the battery string absorption of the layout transfer unit 4, the lead cutting of the layout transfer unit 4, the layout and transfer of the layout transfer unit 4, and the layout operation will not be stopped because of waiting for the input of the next photovoltaic module, the position correction of the next photovoltaic module, and the reset of the tray transfer unit 3, thereby improving the layout efficiency.

In S12, in a process of performing the S9 and the S11, the tray transfer unit 3 descends to a position below the module output unit 2 and returns to the position below the module input unit 1 and is in place.

In the above-described layout step, two sets of layout transfer units 4 may be provided to pick up two rows of battery strings at the same time, so that performing layout operation once can complete a layout of two rows of battery strings. Compared with a single robot layout in the related art, the efficiency of the layout can be more than doubled.

In order to implement an operation requirement of the tray transfer unit 3, that is, tray transfer unit 3 lifts the photovoltaic module on the module input unit 1 upwards, moves according to the set step distance in the second direction in the space above the module output unit 2, places the photovoltaic module on the module output unit 2, and then lowers to the position below the module output unit 2 and moves back to the position below the module input unit 1 in the second direction, the reasonable structure design is performed on the tray transfer unit 3 in this embodiment. Optionally, the tray transfer unit 3 includes a first support plate 31, a driving member 32 that drives the first support plate 31 to move in the second direction, a cylinder 33 fixed on the first support plate 31, and a support frame group 34 that is driven by the cylinder 33 to move up and down and that is used to support the photovoltaic module. The support frame group 34 is driven by the cylinder 33 to perform the position switching between a position above the module output unit 2 and a position below the module output unit 2. The driving member 32, the first support plate 31 and the cylinder 33 are all disposed below the module output unit 2, so that the tray transfer unit 3 can be retracted to the position below the module output unit 2 and moves in the second direction to return to the position below the module input unit 1.

In order that the support frame group 34 can extend into the position below the module input unit 1 to lift the photovoltaic module upwards and can move up and down in the module output unit 2, the support frame group 34 includes a second support plate 341 that is driven by the cylinder 33 to move up and down, a support rod 342 that is fixed on the second support plate 341 and is parallel to the first direction, multiple support upright rods 343 disposed on the support rod 342 at intervals, and support towing rods 344 having first ends fixed on the support upright rods 343 and second ends extending horizontally parallel to the second direction: where a support towing rod of the support towing rods 344 is disposed on a top end of a respective support upright rod of the support upright rods 343 in an overhanging manner and extends in a direction towards the module input unit 1. The module output unit 2 is provide with a first avoidance gap 21 penetrating in the second direction, and the first avoidance gap 21 is capable of accommodating a support upright rod 343 and a support towing rod 344 distributed in the first avoidance gap 21, and the support rod 342 is located below the module output unit 2.

Figure 2:
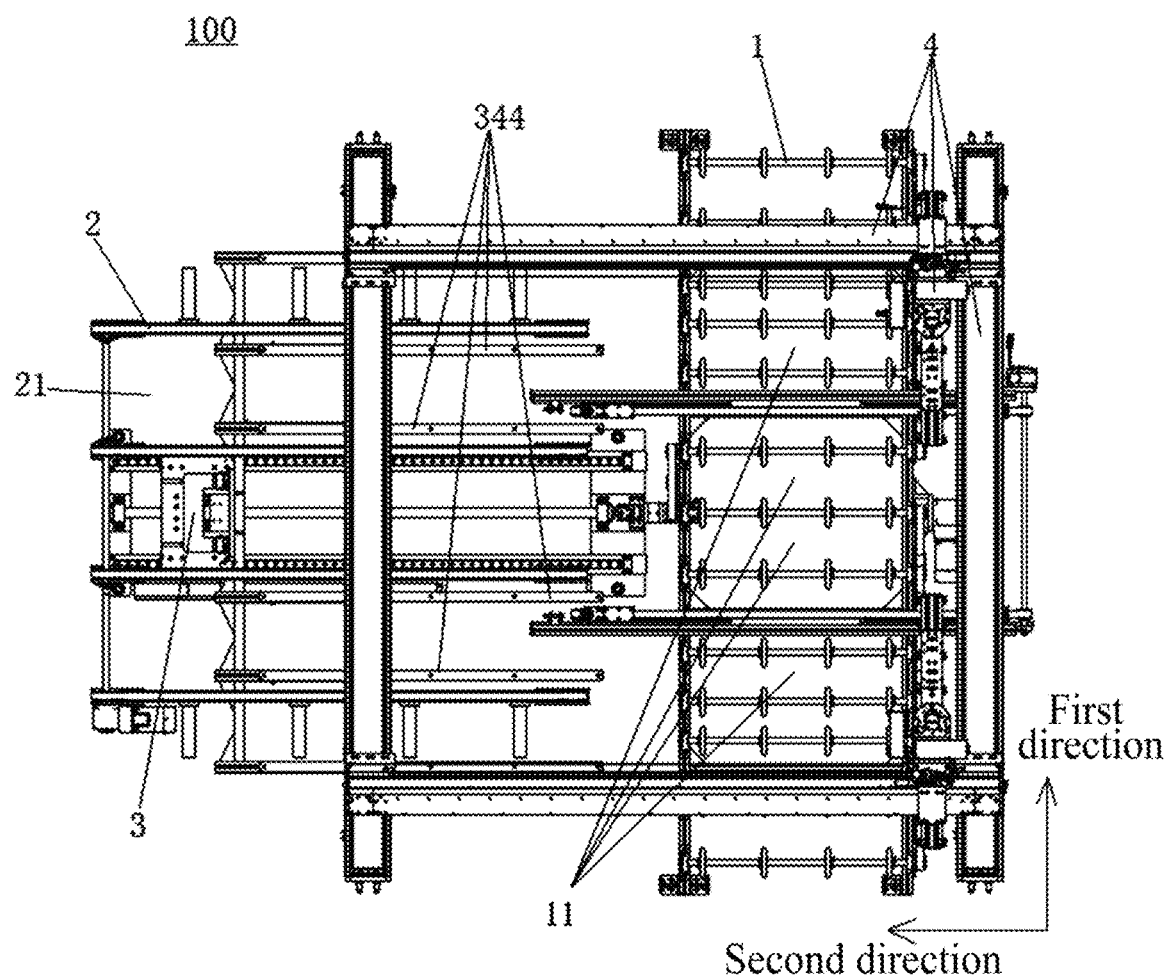
FIG. 2 is a top structural schematic diagram of a layout device according to an embodiment one of the present application.
Figure 3:
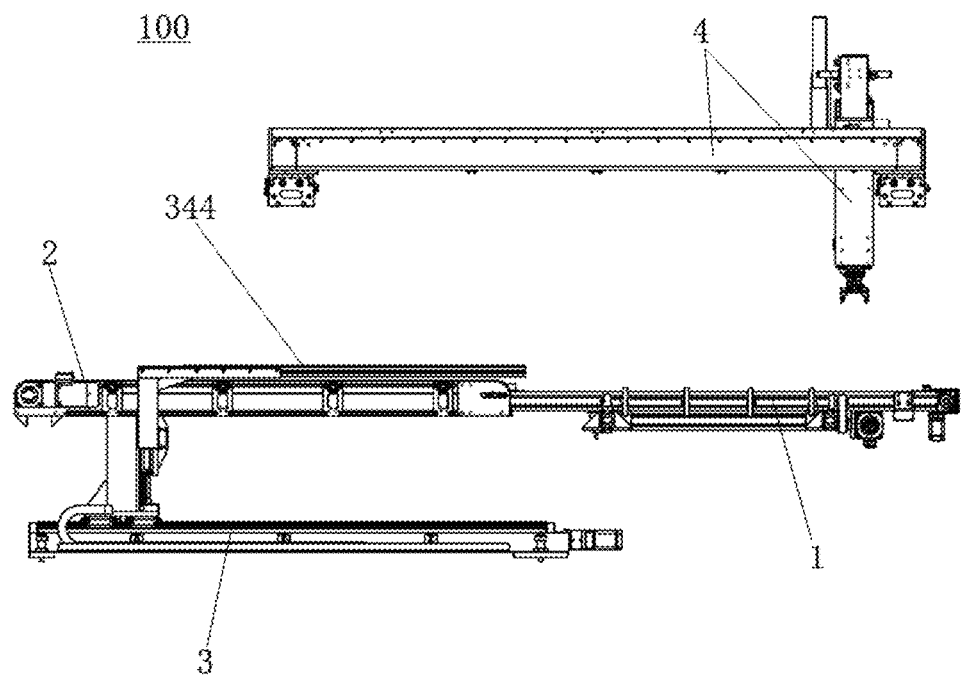
FIG. 3 is a front structural schematic diagram of a layout device according to an embodiment one of the present application.
Figure 4:
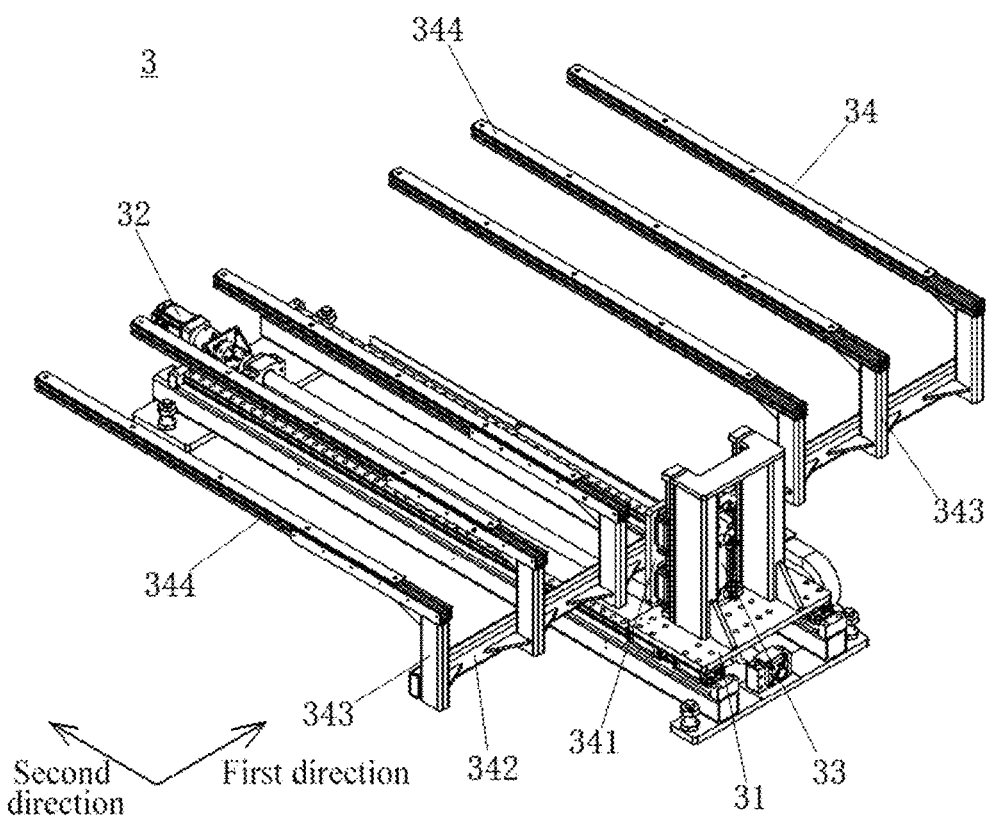
FIG. 4 is a perspective structural schematic diagram of a tray transfer unit according to an embodiment one of the present application.
Figure 5:
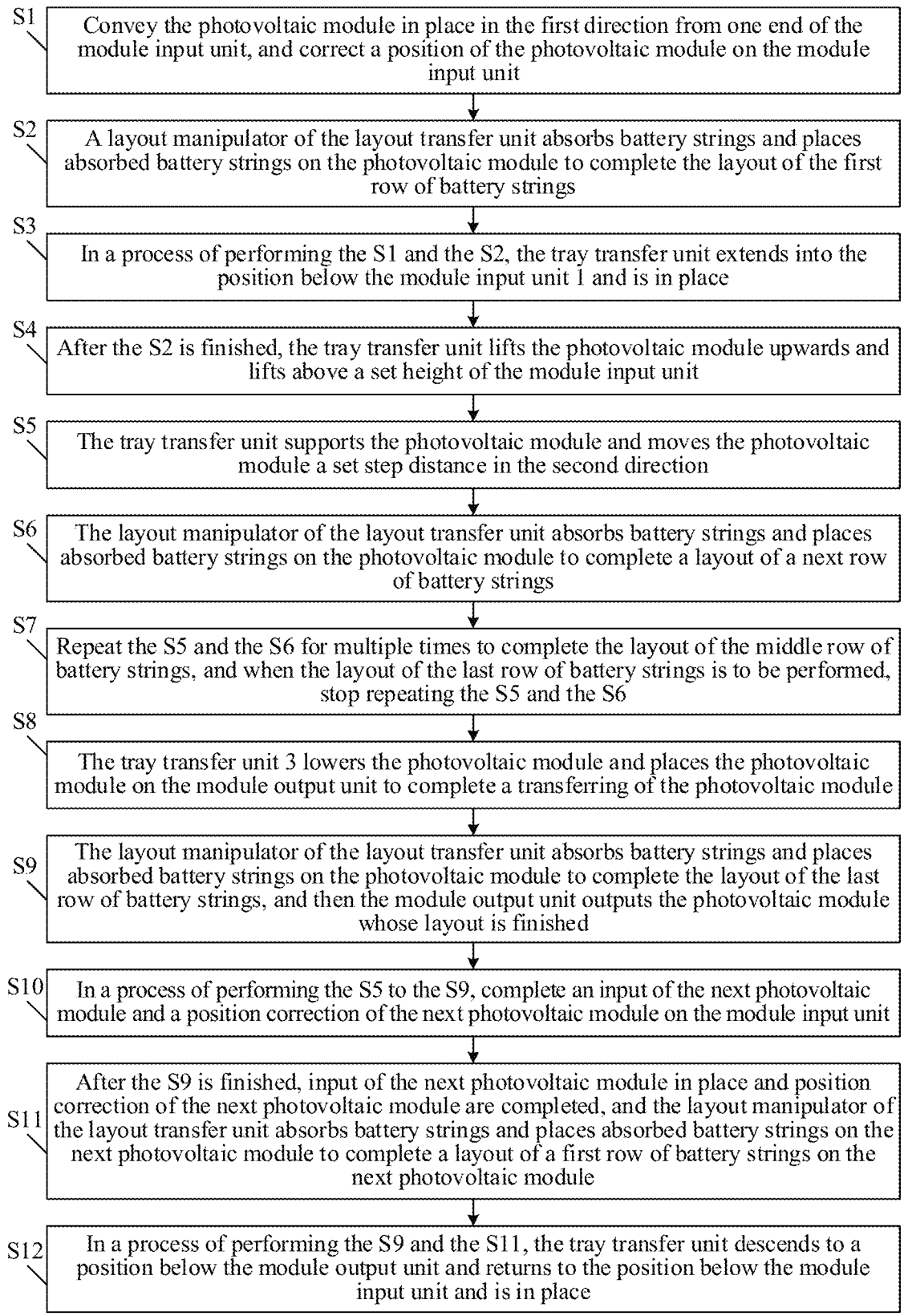
FIG. 5 is a schematic flowchart of a layout method according to an embodiment one of the present application.
Figure 6:
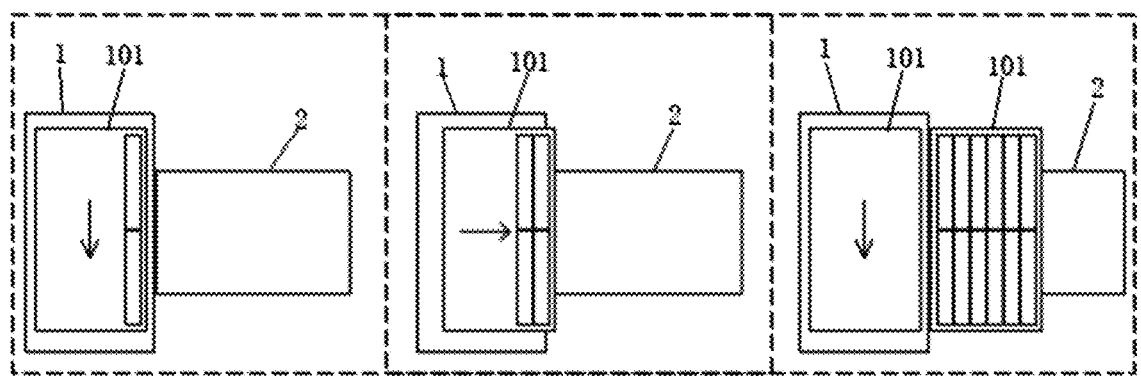
FIG. 6 is a schematic structural diagram of a layout process of a layout device according to an embodiment one of the present application.
Figure 7:
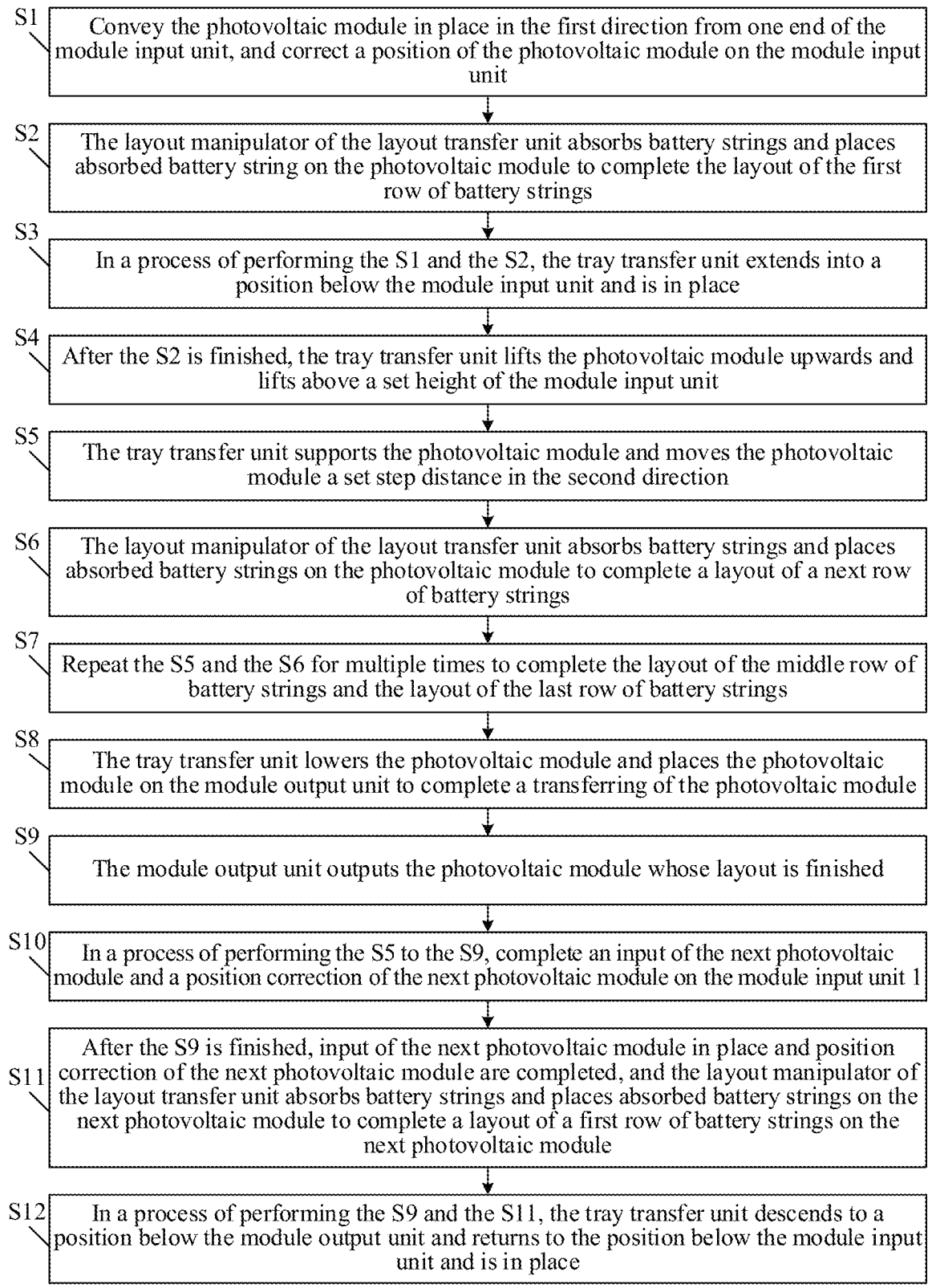
FIG. 7 is a schematic flowchart of a layout method according to an embodiment two of the present application.
Figure 8:
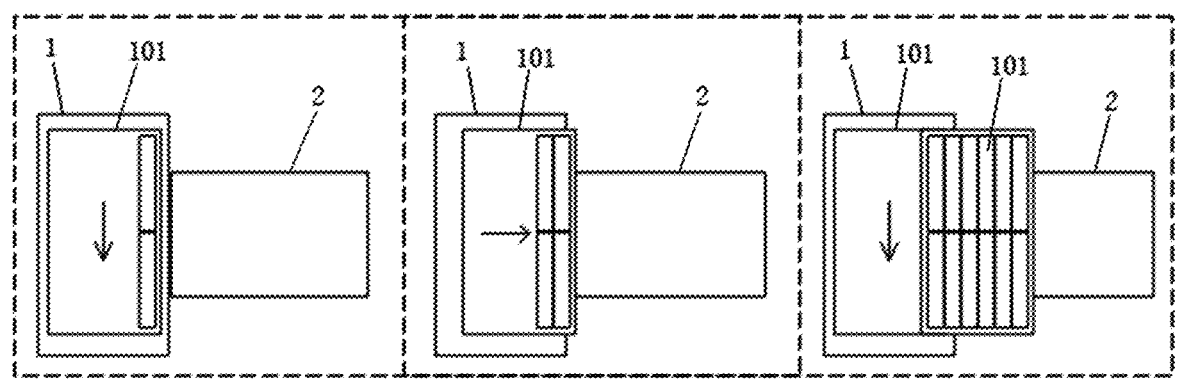
FIG. 8 is a schematic structural diagram of a layout process of a layout device according to an embodiment two of the present application.
Figure 9:
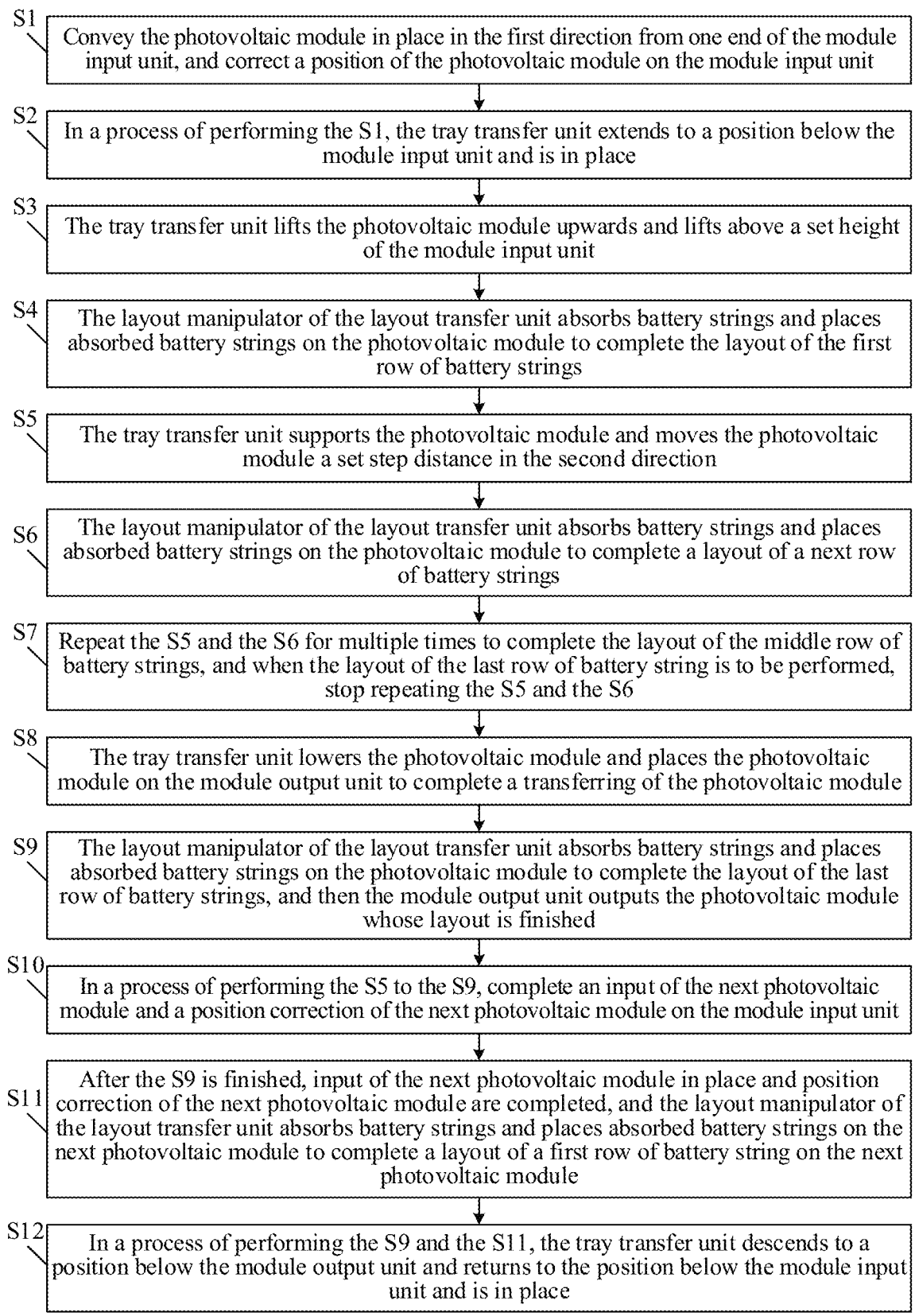
FIG. 9 is a schematic flowchart of a layout method according to an embodiment three of the present application.
Figure 10:
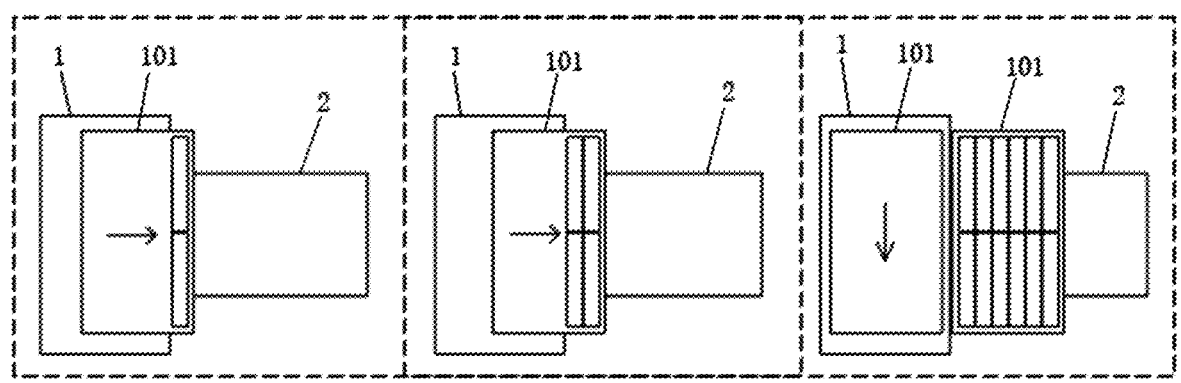
FIG. 10 is a schematic structural diagram of a layout process of a layout device according to an embodiment three of the present application.

As shown in FIG. 2, a second avoidance gap 11 is formed on the module input unit 1, and the second avoidance gap 11 is capable of allowing the support towing rod 344 to extend into the position below the module input unit 1 and is capable of allowing the support towing rod to move upwards above the module input unit 1.

When the support upright rod 343 gets close to the module input unit 1, the overhanging and extending support towing rod 344 may gradually extends into the module input unit 1 and extends to a position below the photovoltaic module. When the support rod 344 gets away from the module input unit 1, the support towing rod 344 may gradually retracts into a conveyance section of the module output unit 2, and the photovoltaic module may be placed on the conveyance plane of the module output unit 2 by moving up and down. The support frame group 34 may be driven by the driving member 32 to achieve the movement with equal step distance, thereby satisfying the layout and transfer requirement.

This embodiment further provides a high-speed layout device 100 for a photovoltaic module. The high-speed layout device 100 for the photovoltaic module includes the module input unit 1, the module output unit 2, the tray transfer unit 3, and the layout loading unit 4 that satisfy the layout requirement in the above-described layout method.

Embodiment Two

This embodiment provides another embodiment of a high-speed layout method. In this embodiment, a layout of the first row of battery strings is performed on the module input unit 1, and a layout of the middle row of battery strings and a layout of the last row of battery strings are performed on the tray transfer unit 3. The method specifically includes the following steps.

In S1, the photovoltaic module 101 is conveyed in place in the first direction from one end of the module input unit 1, and a position of the photovoltaic module 101 on the module input unit 1 is corrected.

In S2, the layout transfer unit 4 absorbs qualified battery strings and places absorbed qualified battery string on the photovoltaic module to complete the layout of the first row of battery strings.

In S3, in a process of performing the S1 and the S2, the tray transfer unit 3 extends into a position below the module input unit 1 and is in place.

In S4, after the S2 is finished, the tray transfer unit 3 lifts the photovoltaic module upwards and lifts above a set height of the module input unit 1, where the set height is greater than a thickness of the photovoltaic module, so that a next photovoltaic module can smoothly enter.

In S5, the tray transfer unit 3 supports the photovoltaic module and moves the photovoltaic module a set step distance in the second direction, where the set step distance is a width of one battery slice.

In S6, the layout transfer unit 4 absorbs qualified battery strings and places absorbed qualified battery strings on the photovoltaic module to complete a layout of a next row of battery strings.

In S7, the S5 and the S6 are repeated for multiple times to complete the layout of the middle row of battery strings and the layout of the last row of battery strings.

In S8, the tray transfer unit 3 supports the photovoltaic module and lowers the photovoltaic module, and places the photovoltaic module on the module output unit 2 to complete a transferring of the photovoltaic module.

In S9, the module output unit 2 outputs the photovoltaic module whose layout is finished.

In S10, in a process of performing the S5 to the S9, an input of the next photovoltaic module and a position correction of the next photovoltaic module on the module input unit 1 are completed, that is, the next photovoltaic module is input onto the module input unit 1 and is in place, and a position of the next photovoltaic module on the module input unit 1 is corrected.

In S11, after the S9 is finished, input of the next photovoltaic module in place and position correction of the next photovoltaic module are completed, and the layout transfer unit 4 absorbs qualified battery strings and places absorbed qualified battery strings on the next photovoltaic module, to complete a layout of a first row of battery strings on the next photovoltaic module and thus achieve the continuous layout operation.

In S12, in a process of performing the S9 and the S11, the tray transfer unit 3 descends to a position below the module output unit 2 and returns to the position below the module input unit 1 and is in place.

Embodiment Three

This embodiment provides still another embodiment of a high-speed layout method. In this embodiment, both a layout of the first row of battery strings and a layout of the middle row of battery strings are performed on the tray transfer unit 3, and a layout of the last row of battery strings is performed on the module output unit 2. The method specifically includes the following steps.

In S1, the photovoltaic module 101 is conveyed in place in the first direction from one end of the module input unit 1, and a position of the photovoltaic module 101 on the module input unit 1 is corrected.

In S2, in a process of performing the S1, the tray transfer unit 3 extends to a position below the module input unit 1 and is in place.

In S3, the tray transfer unit 3 lifts the photovoltaic module upwards and lifts above a set height of the module input unit 1, where the set height is greater than a thickness of the photovoltaic module, so that a next photovoltaic module can smoothly enter.

In S4, the layout transfer unit 4 absorbs qualified battery strings and places absorbed qualified battery strings on the photovoltaic module to complete the layout of the first row of battery strings, where before the layout of the first rows of battery strings is performed, the tray transfer unit 3 may move a distance in the second direction to a preset layout position after the tray transfer unit 3 moves the photovoltaic module to a preset height.

In S5, the tray transfer unit 3 supports the photovoltaic module and moves the photovoltaic module a set step distance in the second direction, where the set step distance is a width of one battery slice.

In S6, the layout transfer unit 4 absorbs qualified battery strings and places absorbed qualified battery strings on the photovoltaic module to complete a layout of a next row of battery strings.

In S7, the S5 and the S6 are repeated for multiple times to complete the layout of the middle row of battery strings, and when the layout of the last row of battery string is to be performed, the S5 and the S6 are stopped repeating.

In S8, the tray transfer unit 3 supports the photovoltaic module and lowers the photovoltaic module, and places the photovoltaic module on the module output unit 2 to complete a transferring of the photovoltaic module.

In S9, the layout transfer unit 4 absorbs qualified battery strings and places absorbed qualified battery strings on the photovoltaic module to complete the layout of the last row of battery strings, and then the module output unit 2 outputs the photovoltaic module whose layout is finished.

In S10, in a process of performing the S5 to the S9, an input of the next photovoltaic module and a position correction of the next photovoltaic module on the module input unit 1 are completed, that is, the next photovoltaic module is input onto the module input unit 1 and is in place, and a position of the next photovoltaic module on the module input unit 1 is corrected.

In S11, after the S9 is finished, input of the next photovoltaic module in place and position correction of the next photovoltaic module are completed, and the layout transfer unit 4 absorbs qualified battery strings and places absorbed qualified battery strings on the next photovoltaic module, to complete a layout of a first row of battery string on the next photovoltaic module and thus achieve the continuous layout operation.

In S12, in a process of performing the S9 and the S11, the tray transfer unit 3 descends to a position below the module output unit 2 and returns to the position below the module input unit 1 and is in place.

In the above-described three embodiments, when the layout transfer unit 4 typesets the first row of battery strings, the middle row of battery strings, and the last row of battery strings, positions of the layout transfer unit 4 for placing the battery strings may be the same or different. For example, when the first row of battery strings and the middle row of battery strings are typeset, positions of the layout transfer unit 4 for placing the first row of battery strings and the middle row of battery strings are the same, however, when the last row of battery strings are typeset, a position of the layout transfer unit 4 for placing the last row of battery strings is different from the positions of the layout transfer unit 4 for placing the first row of battery strings and the middle row of battery strings. Alternatively, when the middle row of battery strings and the last row of battery strings are typeset, positions of the layout transfer unit 4 for placing the battery strings are the same, however, when the first row of battery strings are typeset, a position of the layout transfer unit 4 for placing the first row of battery strings is different from the positions of the layout transfer unit 4 for placing the middle row of battery strings and the last row of battery strings. Alternatively, when the first row of battery strings, the middle row of battery strings and the last row of battery strings are typeset, positions of the layout transfer unit 4 for placing the battery strings are all the same. During the layout, the position change of the layout transfer unit 4 upon placing the battery strings is reduced as much as possible, so that on the one hand, the programming difficulty is reduced, and on the other hand, the layout precision is improved. Moreover, during the layout, the distance of the layout transfer unit 4 transferring in the second direction is reduced as much as possible, the time for absorbing the battery strings for transferring is shortened, and thus the layout efficiency is improved. In this method, placing positions of multiple rows of battery strings during layout are disposed at the same position, so that the time for absorbing the battery strings for transferring is shortened and thus the layout efficiency is improved.

In the method, the occupation of the tray transfer unit by the layout of the first row of battery strings is staggered with the occupation of the tray transfer unit by the layout of the last row of battery strings, that is, the layout of the first row of battery strings is designed to be performed on the module input unit 1, or the last row of battery strings is designed to be performed on the module output unit 2, so that the occupation of the tray transfer unit 3 is released. An operation that the tray transfer unit 3 moves from the module output unit 2 and returns to the position below the module input unit 1 in place is completed in this time period in which the occupation of the tray transfer unit 3 is released so that the operation does not occupy additional time for layout the battery strings. Moreover, in a time period in which after the photovoltaic module on the module input unit 1 is lifted and before the layout of the next photovoltaic module is performed, the operations of input the next photovoltaic module in place and position correction of the next photovoltaic module on the module input unit are completed without additionally occupy the layout time of the battery strings. Therefore, after a layout of a previous photovoltaic module is completed, the layout transfer unit 4 can continuously perform the layout of the next photovoltaic module without waiting for the next photovoltaic module midway, so that the tact time consumed in preparation of the layout of the next photovoltaic module is saved, the continuous layout process is achieved, and thus the layout efficiency is improved.

Compared with the related art, the high-speed layout method for the photovoltaic module and the high-speed layout device for the photovoltaic module provided in the present application have the following beneficial effects.

(1) The layout of the battery strings is divided into the layout of the first row of battery strings layout, the layout of the middle row of battery strings layout, and the layout of the last row of battery strings layout. The main layout transfer operation is undertaken by the tray transfer unit, the first row of battery strings are allocated to the module input unit or the last row of battery strings are allocated to the module output unit, so that the simultaneous occupation of the tray transfer unit is released, and a time period in which the tray transfer unit is released is used to complete the operation that the tray transfer unit moves from the module output unit and returns to the position below the module input unit in place without additionally occupying the layout time of the battery strings.

(2) In the time period in which after the photovoltaic module on the module input unit is lifted and before the layout of the next photovoltaic module is performed, the operations of input the next photovoltaic module in place and position correction of the next photovoltaic module on the module input unit are completed without additionally occupying the layout time of the battery strings. After the layout of the previous photovoltaic module is completed, the layout transfer unit can continuously perform the layout of the next photovoltaic module without waiting for the next photovoltaic module midway, so that the tact time consumed in preparation of the layout of the next photovoltaic module and in returning to the position below the module input unit by the tray transfer unit is saved, the continuous layout process is achieved, and thus the layout efficiency is improved.

(3) When layout battery strings by moving the glass, the layout of the middle row of battery strings is performed at the same position, the layout of the first row of battery strings and the layout of the last battery strings may be designed at the same position as the layout of the middle row of battery string or designed on a side of the layout of the middle row of battery string depending on the situation, so that the transfer distance of the layout transfer unit is reduced as a whole, and the consumption of the time for absorbing the battery strings for transferring is reduced, and thus the layout efficiency is improved.

What is claimed is:
1. A high-speed layout method for a photovoltaic module, comprising:
configuring a module input unit and a module output unit, wherein the module input unit is configured to convey the photovoltaic module in a first direction, the module output unit is configured to convey the photovoltaic module in a second direction, and the first direction is perpendicular to the second direction;

configuring a tray transfer unit, wherein the tray transfer unit is configured to be capable of extending into a position below the module input unit to lift the photovoltaic module on the module input unit upwards, moving in the second direction in a space above the module output unit according to a layout requirement, descending and embedding below the module output unit, placing the photovoltaic module on the module output unit, and returning to the position below the module input unit in the second direction;

configuring a layout transfer unit, wherein the layout transfer unit is configured to be capable of absorbing battery strings, and placing the battery strings on the photovoltaic module according to the layout requirement;

dividing the battery strings on the photovoltaic module into a first row of battery strings, a middle row of battery strings, and a last row of battery strings, wherein a layout of the middle row of battery strings is performed on the tray transfer unit, a layout of the first row of battery strings is performed on the module input unit or the tray transfer unit, a layout of the last row of battery strings is performed on the tray transfer unit or the module output unit, and the layout of the first row of battery strings and the layout of the last row of battery strings are performed on different units;

in a process of layout the first row of battery strings or the last row of battery strings, making the tray transfer unit move from below the module output unit to below the module input unit; and in a process in which the photovoltaic module on the module input unit is lifted by the tray transfer unit until the layout of the last row of battery strings on the photovoltaic module is finished, completing, operations of input a next photovoltaic module in place and position correction of the next photovoltaic module on the module input unit.

2. The high-speed layout method for a photovoltaic module of claim 1, wherein the layout of the first row of battery strings is performed on the module input unit, the layout of the last row of battery strings is performed on the module output unit, and the layout of the middle row of battery strings is performed on the tray transfer unit.

3. The high-speed layout method for a photovoltaic module of claim 2, further comprising:

S1, conveying the photovoltaic module in place in the first direction from one end of the module input unit, and correcting a position of the photovoltaic module on the module input unit;

S2, absorbing battery strings and placing absorbed battery strings on the photovoltaic module by the layout transfer unit to complete the layout of the first row of battery strings;

S3, in a process of performing the S1 and the S2, extending the tray transfer unit to the position below the module input unit and making the tray transfer unit be in place;

S4, after the S2 is finished, lifting, by the tray transfer unit, the photovoltaic module upwards and above a set height of the module input unit;

S5, supporting, by the tray transfer unit, the photovoltaic module to move a set step distance in the second direction;

S6, absorbing battery strings and placing absorbed battery strings on the photovoltaic module by the layout transfer unit to complete a layout of a next row of battery strings;

S7, repeating the S5 and the S6 for multiple times to complete the layout of the middle row of battery strings, and in response to that the layout of the last row of battery strings is to be performed, stopping repeating the S5 and the S6;

S8, lowering the tray transfer unit and placing, by the tray transfer unit, the photovoltaic module on the module output unit to complete a transferring of the photovoltaic module;

S9, absorbing battery strings and placing absorbed battery strings on the photovoltaic module by the layout transfer unit to complete the layout of the last row of battery strings, and then outputting, by the module output unit, the battery strings;

S10, in a process of performing the S5 to the S9, completing an input of the next photovoltaic module and a position correction of the next photovoltaic module on the module input unit;

S11, after the S9 is finished, input of the next photovoltaic module in place and position correction of the next photovoltaic module are completed, absorbing battery strings and placing absorbed battery strings on the next photovoltaic module by the layout transfer unit to complete a layout of a first row of battery strings on the next photovoltaic module; and S12, in a process of performing the S9 and the S11, lowering the tray transfer unit to a position below the module output unit, returning the tray transfer unit to the position below the module input unit, and making the tray transfer unit be in place.

4. The high-speed layout method for a photovoltaic module of claim 1, wherein the layout of the first row of battery strings is performed on the module input unit, and the layout of the middle row of battery strings and the layout of the last row of battery strings are performed on the tray transfer unit.

5. The high-speed layout method for a photovoltaic module of claim 4, further comprising:

S1, conveying the photovoltaic module in place in the first direction from one end of the module input unit, and correcting a position of the photovoltaic module on the module input unit;

S2, absorbing battery strings and placing absorbed battery strings on the photovoltaic module by the layout transfer unit to complete the layout of the first row of battery strings;

S3, in a process of performing the S1 and the S2, extending the tray transfer unit to the position below the module input unit and making the tray transfer unit be in place;

S4, after the S2 is finished, lifting, by the tray transfer unit, the photovoltaic module upwards and above a set height of the module input unit;

S5, supporting, by the tray transfer unit, the photovoltaic module to move a set step distance in the second direction;

S6, absorbing battery strings and placing absorbed battery strings on the photovoltaic module by the layout transfer unit to complete a layout of a next row of battery strings;

S7, repeating the S5 and the S6 for multiple times to complete the layout of the middle row of battery strings and the layout of the last row of battery strings;

S8, lowering the tray transfer unit, and placing, by the tray transfer unit, the photovoltaic module on the module output unit to complete a transferring of the photovoltaic module;

S9, outputting, by the module output unit, the photovoltaic module whose layout is finished;

S10, in a process of performing the S5 to the S9, completing an input of the next photovoltaic module and a position correction of the next photovoltaic module on the module input unit;

S11, after the S9 is finished, input of the next photovoltaic module in place and position correction of the next photovoltaic module are completed, absorbing battery strings and placing absorbed battery strings on the next photovoltaic module by the layout transfer unit to complete a layout of a first row of battery strings on the next photovoltaic module; and S12, in a process of performing the S9 and the S11, lowering the tray transfer unit to a B position below the module output unit, returning the tray transfer unit to the position below the module input unit, and making the tray transfer unit be in place.

6. The high-speed layout method for a photovoltaic module of claim 1, wherein the layout of the first row of battery strings and the layout of the middle row of battery strings are performed on the tray transfer unit, and the layout of the last row of battery strings is performed on the module output unit.

7. The high-speed layout method for a photovoltaic module of claim 6, further comprising:

S1, conveying the photovoltaic module in place in the first direction from one end of the module input unit, and correcting a position of the photovoltaic module on the module input unit;

S2, in a process of performing the S1, extending the tray transfer unit to the position below the module input unit and making the tray transfer unit be in place;

S3, lifting, by the tray transfer unit, the photovoltaic module upwards and above a set height of the module input unit;

S4, absorbing battery strings and placing absorbed battery strings on the photovoltaic module by the layout transfer unit to complete the layout of the first row of battery strings;

S5, supporting, by the tray transfer unit, the photovoltaic module to move a set step distance in the second direction;

S6, absorbing battery strings and placing absorbed battery strings on the photovoltaic module by the layout transfer unit to complete a layout of a next row of battery strings;

S7, repeating the S5 and the S6 for multiple times to complete the layout of the middle row of battery strings, and in response to that the layout of the last row of battery strings is to be performed, stopping repeating the S5 and the S6;

S8, lowering the tray transfer unit and placing, by the tray transfer unit, the photovoltaic module on the module output unit to complete a transferring of the photovoltaic module;

S9, absorbing battery strings and placing absorbed battery strings on the photovoltaic module by the layout transfer unit to complete the layout of the last row of battery strings, and then outputting, by the module output unit, the photovoltaic module;

S10, in a process of performing the S5 to the S9, completing an input of the next photovoltaic module and a position correction of the next photovoltaic module on the module input unit;

S11, after the S9 is finished, input of the next photovoltaic module in place and position correction of the next photovoltaic module are completed, absorbing qualified battery strings and placing absorbed qualified battery strings on the next photovoltaic module by the layout transfer unit to complete a layout of a first row of battery strings on the next photovoltaic module; and S12, in a process of performing the S9 and the S11, lowering the tray transfer unit to a position below the module output unit, returning the tray transfer unit to the position below the module input unit, and making the tray transfer unit be in place.

8. The high-speed layout method for a photovoltaic module of claim 1, wherein a height difference exists between a conveyance plane of the module input unit and a conveyance plane of the module output unit, the height difference is greater than a thickness of the photovoltaic module, and an overlapping portion exists between a projection region of a photovoltaic module on the module output unit in a vertical direction and a projection region of a photovoltaic module on the module input unit in the vertical direction.

9. The high-speed layout method for a photovoltaic module of claim 1, wherein a conveyance plane of the module input unit is flush with a conveyance plane of the module output unit, and a photovoltaic module on the module output unit and a photovoltaic module on the module input unit have a gap on a horizontal plane without mutual interference.

10. The high-speed layout method for a photovoltaic module of claim 1, wherein the layout transfer unit is configured with two sets of layout transfer units, and a layout operation once is performed to complete a layout of a row of battery strings.

11. The high-speed layout method for a photovoltaic module of claim 1, wherein the tray transfer unit comprises a first support plate, a driving member that drives the first support plate to move in the second direction, a cylinder fixed on the first support plate, and a support frame group that is driven by the cylinder to move up and down;

the support frame group comprises a second support plate that is driven by the cylinder to move up and down, a support rod that is fixed on the second support plate and is parallel to the first direction, a plurality of support upright rods disposed on the support rod at intervals, and support towing rods having first ends fixed on the plurality of support upright rods and second ends extending horizontally parallel to the second direction; wherein a support towing rod of the support towing rods is disposed on a top end of a respective support upright rod of the plurality of support upright rods in an overhanging manner and extends in a direction towards the module input unit; and the module output unit is provided with a first avoidance gap penetrating in the second direction, and the first avoidance gap is capable of accommodating a support upright rod of the support upright rods and a support towing rod of the support towing rods interleaved and distributed in the first avoidance gap, the support rod is located below the module output unit, a second avoidance gap is formed on the module input unit, and the second avoidance gap is capable of allowing the support towing rod to extend into the position below the module input unit and is capable of allowing the support towing rod to move upwards above the module input unit.

12. A high-speed layout device for a photovoltaic module, performing a layout operation according to the layout method of claim 1.

* * * * *